(12) United States Patent
Eckhardt et al.

(10) Patent No.: US 6,441,602 B1
(45) Date of Patent: Aug. 27, 2002

(54) METHOD AND APPARATUS FOR DETERMINING PHASE LOCKED LOOP JITTER

(75) Inventors: James P. Eckhardt, Pleasant Valley; Keith A. Jenkins, Sleepy Hollow, both of NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 09/669,529

(22) Filed: Sep. 26, 2000

(51) Int. Cl.[7] .............................................. G01R 23/12
(52) U.S. Cl. .................... 324/76.53; 324/141; 324/142; 327/156
(58) Field of Search ................................ 324/76.53, 102, 324/121 R, 76.61, 76.55, 76.59, 76.77, 158.1, 141, 142; 327/156, 376; 370/477; 702/69; 325/32, 34, 325; 331/25, 11

(56) References Cited

U.S. PATENT DOCUMENTS 3,983,498 A * 9/1976 Malek .......................... 327/156
6,005,872 A * 12/1999 Bassi ........................... 370/477
6,185,510 B1 * 2/2001 Inoue ............................. 702/69

OTHER PUBLICATIONS

Measuring Jitter and Phase Error in Microprocessor Phase-–Locked Loops, Keith A. Jenkins and James P. Eckhardt, IEEE Design & Test of Computers, Apr.–Jun. 2000, pp. 6–8, 88–93.

* cited by examiner

Primary Examiner—Michael Sherry
Assistant Examiner—Trung Nguyen
(74) Attorney, Agent, or Firm—Lynn Augspurger; Cantor Colburn LLP

(57) ABSTRACT

An exemplary embodiment of the invention is a method for evaluating jitter of a phase locked loop circuit generating a phase locked loop output signal. The method includes generating a test initiate signal and generating a trigger signal in response to the test initiate signal. The trigger signal is synchronized with the phase locked loop output signal. A disturbance signal is generated to induce jitter in the phase locked loop output signal. The jitter in the phase locked loop output signal is then evaluated.

16 Claims, 3 Drawing Sheets

FIG. 3A  SYNCHRONOUS IN
FIG. 3B  SCOPE TRIGGER SYNCHRONOUS TO PLL
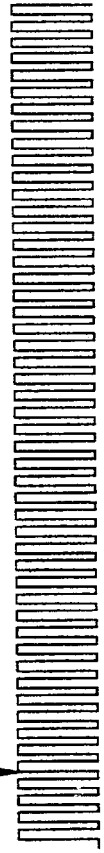
FIG. 3C  PLL OUTPUT
$\Delta t$ = PHASE ERROR
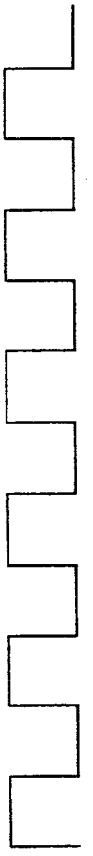
FIG. 3D  REFERENCE CLOCK
FIG. 3E  ANALOG $V_{DD}$

METHOD AND APPARATUS FOR DETERMINING PHASE LOCKED LOOP JITTER

FIELD OF THE INVENTION

The invention relates to testing integrated circuits, and, more particularly, to a method and apparatus for measuring jitter in phase locked loops.

BACKGROUND OF THE INVENTION

Phase locked loops (PLLs) have been used for clock generation in microprocessors. One advantage to using a PLL is the multiplication of the reference clock frequency. The PLL can generate an output clock or multiple output clocks, that are a multiple of the reference clock frequency, with each of the PLL clocks being phase aligned.

The advantages of a PLL become lost if the PLL experiences "jitter" or variation of the phase alignment. Thus, there exist test methods to detect the presence of PLL jitter. PLL jitter is often measured deterministically, finding a distribution of jitter and computing the standard deviation to obtain a 3 sigma jitter number. While this is an acceptable test method for most specifications, a single PLL phase variation event can cripple high speed integrated circuits. Thus, there is a need for an absolute measurement of PLL jitter rather than a statistical one.

BRIEF SUMMARY OF THE INVENTION

An exemplary embodiment of the invention is a method for evaluating jitter of a phase locked loop circuit generating a phase locked loop output signal. The method includes generating a test initiate signal and generating a trigger signal in response to the test initiate signal. The trigger signal is synchronized with the phase locked loop output signal. A disturbance signal is generated to induce jitter in the phase locked loop output signal. The jitter in the phase locked loop output signal is then evaluated.

BRIEF DESCRIPTION OF THE DRAWINGS

Referring now to the drawings wherein like elements are numbered alike in the several FIGURES:

FIGS. 3A–3E are waveforms of signals in the test circuit of FIG. 2.

DETAILED DESCRIPTION OF THE PREFERRED EMBODIMENTS

Figure 1:
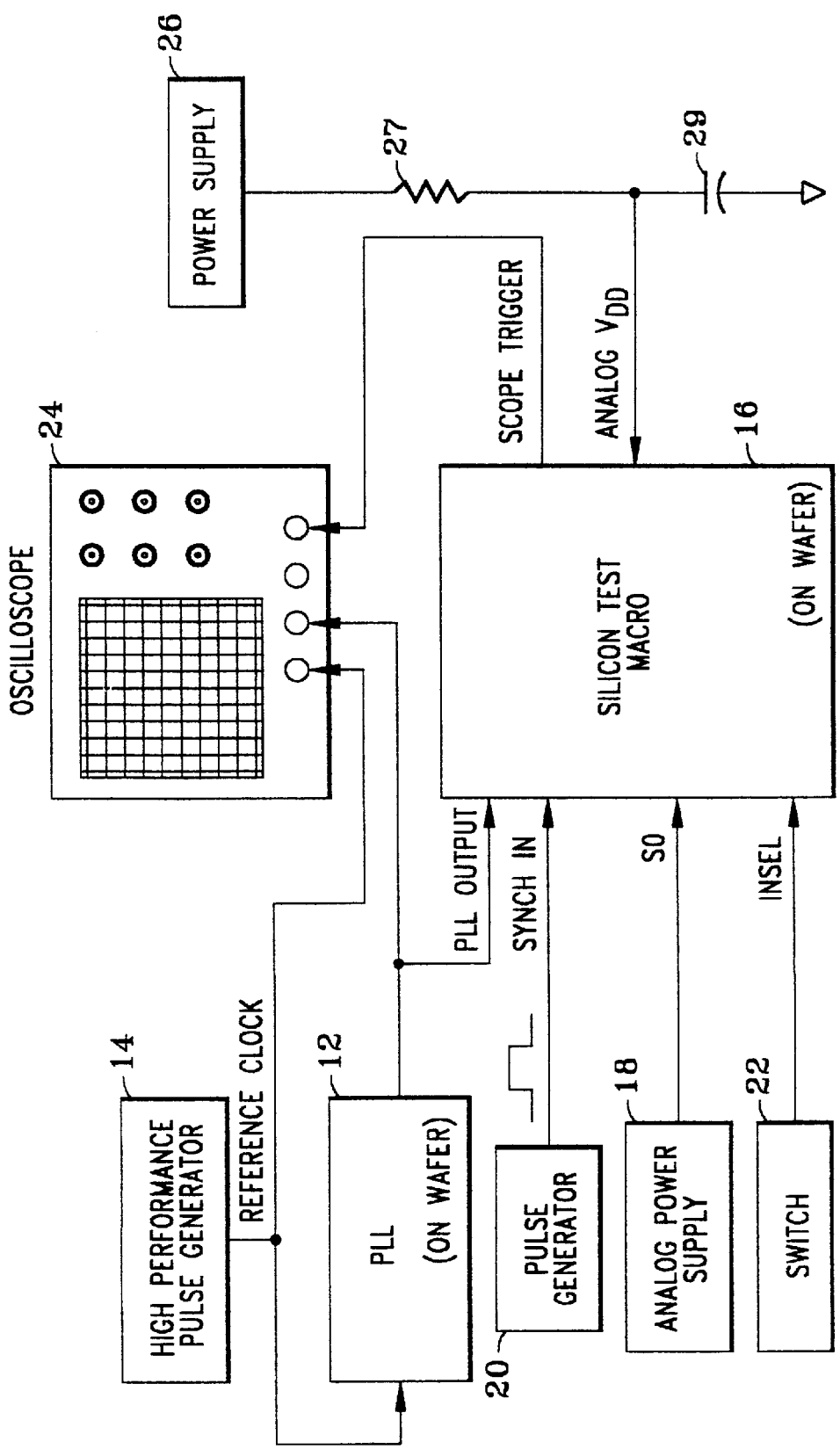
FIG. 1 is a block diagram of an exemplary test system.

FIG. 1 is a diagrammatic view of a test system for testing PLL jitter. The system generates a disturbance signal, such as power supply noise, and measures the effect on PLL jitter. The test system generates noise in the PLL power supply and measures the phase variance or jitter in the PLL output. By controlling the noise introduced in the PLL power supply and detecting the PLL jitter, a relationship between supply voltage and phase jitter can be derived. The test system can characterize the jitter as a function of power supply noise, and result in specific waveforms of jitter vs time correlated to power supply noise vs time. The magnitude and shape of power supply noise pulse can be correlated to a specific phase jitter. The relationship of power supply noise to jitter can be used to predict and compensate for phase jitter by monitoring the PLL supply voltage.

The test system includes a PLL 12 which receives a reference clock 14 and generates a PLL output which may be a multiple of the reference clock signal. The PLL 12 is implemented in an integrated circuit. The output of the PLL 12 is provided to a test device 16. As shown in FIG. 1, the test device is implemented in an integrated circuit, but the invention is not limited to integrated circuit implementations. The PLL 12 is powered by a PLL power supply 26 which generates the PLL supply voltage $V_{DD}$. Another power supply 18 generates a voltage $V_{SO}$ which is used to control the magnitude of noise on the PLL supply voltage $V_{DD}$ as described herein with reference to FIG. 2. A pulse generator 20 generates a synch_in pulse or test initiation signal to initiate the introduction of noise on PLL supply voltage $V_{DD}$. A switch 22 generates a signal labeled insel which designates the frequency of the noise introduced on the PLL supply voltage. Test equipment such as oscilloscope 24 is coupled to the reference clock 14. The probe of the oscilloscope 24 is coupled to the output of the PLL 12. The trigger input of the oscilloscope 24 is connected to a scope trigger point on the test device 16.

Figure 2:
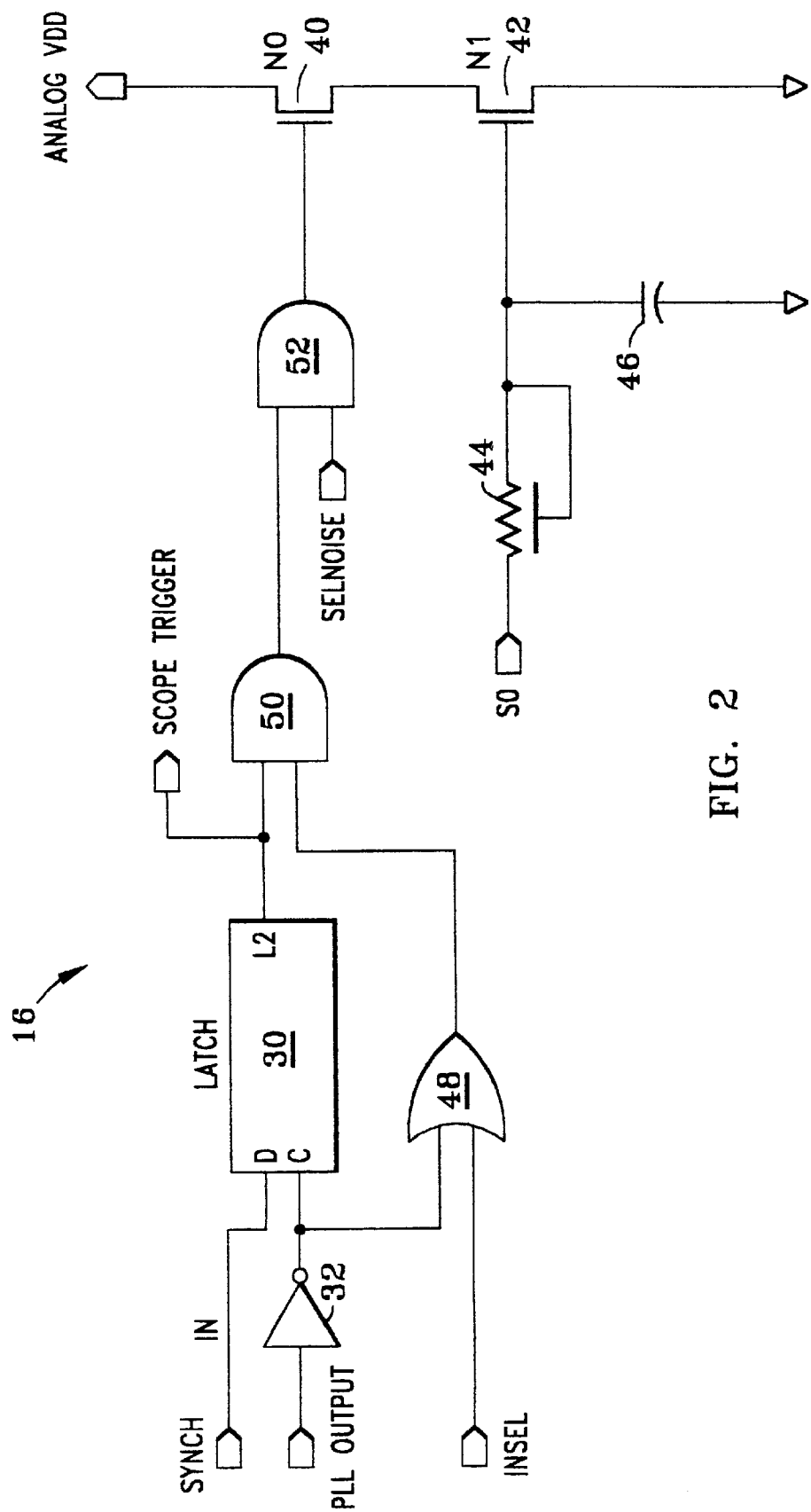
FIG. 2 is a schematic diagram of an exemplary test circuit.

FIG. 2 is schematic diagram of the test device 16. The test device includes a latch 30 for generating a scopetrigger signal. The synch_in signal initiates the introduction of noise to the PLL supply voltage. If, however, the synch in pulse is used as the oscilloscope trigger, the test system would not provide accurate results. The trigger to the oscilloscope 24 would be asynchronous to the PLL 12 output and measurements could only be made via a "one-shot" oscilloscope. To accurately trigger the oscilloscope 24, a storage device 30 (e.g., a latch) is used. The data input of the latch 30 receives the synch_in signal. The clock input of latch 30 is driven by the output of PLL 12 through an inverter 32. The oscilloscope trigger input is coupled to the latch 30 output as shown in FIG. 2. By latching the synch in pulse with the PLL output as the latch clock, the oscilloscope 24 becomes synchronized to the PLL, so that each occurrence of the PLL edge has the same time relationship to the oscilloscope trigger. A sampling oscilloscope can now be used which has better accuracy and are much more abundant. Since the synch_in pulse triggers the oscilloscope 24 and defines the initiation of measurements, it is guaranteed that only the PLL transitions that occur during the synch_in pulse event are measured by oscilloscope 24.

Test device 16 also includes components for controlling the nature of the noise on the PLL supply voltage $V_{DD}$. Noise is introduced on the voltage $V_{DD}$ through two switches 40 and 42 which are implemented through MOSFET devices in the exemplary embodiment of the invention. The switches 40 and 42 provide a path to ground to drop the supply voltage $V_{DD}$ to introduce noise. The PLL power supply 26 is coupled to ground through resistor 27 and capacitor 29. The use of a large resistor 27 creates a small noise current (e.g., 2 mA) thereby minimizing voltage due to inductance in the path.

Switch 42 controls the magnitude of the voltage drop in response to a signal (e.g., a voltage) $V_{SO}$ applied through resistor 44 and capacitor 46 to the control input of switch 42. In the embodiment shown in FIG. 2, switch 42 is a MOSFET device and thus the control input is the gate of the MOSFET device. As known the art, the magnitude of the voltage on the gate of switch 42 will be proportional to the current flowing through the switch 42 from voltage $V_{DD}$ to ground. In this manner, the magnitude of the voltage drop on voltage $V_{DD}$ is controlled by the magnitude of input signal S0.

The frequency of the noise on the voltage $V_{DD}$ is controlled by switch 40. An OR gate 48 receives the inverted output of the PLL from inverter 32 and frequency selection signal insel from switch 22. If the frequency selection signal is high, then the output of the OR gate 48 is a steady logic high. The output of OR gate 48 is provided to AND gate 50. The other input to AND gate 50 is the output of latch 30. The state of latch 30 corresponds to the state of the synch_in signal from pulse generator 20. Thus, the output of AND gate 50 is only high when the output of latch 30 is high. In this manner, noise is introduced on the voltage $V_{DD}$ only when the synch_in pulse is present.

The output of AND gate 50 is provided to AND gate 52. The other input to AND gate 52 is a noise enable signal labeled selnoise. The noise enable signal controls whether any noise will be introduced on the voltage $V_{DD}$. When the noise enable signal is low, AND gate 52 generates a low output to switch 40 which prevents current from flowing from power supply 26, through switch 40 to ground. When the noise enable signal is high, the output of AND gate 52 is applied to switch 40. When the frequency selection signal is high, the output of AND gate 52 is a steady high value (assuming the output of latch 30 is high and the noise enable signal is high). This allows switch 40 to being conducting current. If either the noise enable signal or the latch 30 output goes low, the output of AND gate 52 goes low thus preventing switch 40 from conducting current.

If the frequency selection signal is low, the output of OR gate 48 is a pulse train corresponding to the inverted output of the PLL. This causes AND gate 52 to output a series of pulses (assuming the output of latch 30 is high and the noise enable signal is high) that are applied to switch 40. This causes switch 40 to periodically conduct current causing a high frequency noise on the voltage $V_{DD}$.

FIGS. 3A–3E are waveforms depicting signals in the test system of FIG. 1. As shown in FIG. 3A, the synch_in pulse generated by pulse generator 20 defines the period during which noise is introduced on voltage $V_{DD}$. The synchronization pulse synch_in is clocked into latch 30 on the next rising edge of the PLL signal. As shown in FIGS. 3B and 3C, when the PLL output is a rising edge, the synchronization pulse is clocked into latch 30 thereby generating a rising edge on the scope trigger signal which is the output of latch 30. Thus, the oscilloscope is synchronized to the PLL output.

As shown in FIG. 3E, the voltage $V_{DD}$ begins to drop when the latch 30 output goes high. The drop in the voltage $V_{DD}$, which powers PLL 12, causes a phase error or jitter between the PLL output in FIG. 3C and the reference clock 14 shown in FIG. 3D. In this manner, the relationship between the shape and magnitude of noise introduced on the PLL supply voltage $V_{DD}$ and the jitter in the PLL output can be determined. The relationship of power supply noise to jitter can be used to predict and compensate for phase jitter by monitoring the PLL supply voltage.

This test device 16 is totally self-contained and can be done at various stages of integrated circuit fabrication or, preferably, as a stand alone pad cage experiment. Consequently, it is available from the fab line sooner and does not require a product vehicle, but rather can be placed on even the most elementary test vehicle. The test system of the present invention has separate noise generators that only effect the PLLs analog power supply, thus creating only analog PLL jitter.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method for evaluating jitter of a phase locked loop circuit generating a phase locked loop output signal, the method comprising:

generating a test initiate signal;

generating a trigger signal responsive to said test initiate signal;

synchronizing said trigger signal with said phase locked loop output signal;

generating a disturbance signal to induce jitter in said phase locked loop output signal; and, evaluating said jitter in said phase locked loop output signal.

2. The method of claim 1 wherein:

said synchronizing includes applying said test initiate signal to a storage device, and outputting said test initiate signal from said storage device in response to said phase locked loop output signal;

wherein an output of said storage device is said trigger signal.

3. The method of claim 2 wherein:

said storage device is a latch.

4. The method of claim 1 wherein:

said phase locked loop circuit is powered by a phase locked loop voltage; and, said disturbance signal is fluctuation in said phase locked loop voltage.

5. The method of claim 4 wherein:

said disturbance signal is generated by coupling said phase locked loop voltage to ground through a first switch.

6. The method of claim 5 wherein said first switch controls the frequency of the disturbance signal.

7. The method of claim 5 wherein:

said disturbance signal is further generated by coupling said phase locked loop voltage to ground through a second switch.

8. The method of claim 7 wherein said second switch controls the magnitude of the disturbance signal.

9. A system for evaluating jitter of a phase locked loop circuit generating a phase locked loop output signal, the system comprising:

a pulse generator for generating a test initiate signal;

a storage device for generating a trigger signal responsive to said test initiate signal;

said storage device synchronizing said trigger signal with a clock signal of said phase locked loop circuit;

circuitry for generating a disturbance signal to induce jitter in said phase locked loop output signal; and, test equipment for evaluating said jitter in said phase locked loop output signal.

10. The system of claim 9 wherein:

said storage device receives said test initiate signal and outputs said test initiate signal in response to said phase locked loop output signal;

wherein an output of said storage device is said trigger signal.

11. The system of claim 9 wherein:

said storage device is a latch.

12. The system of claim 9 wherein:

said phase locked loop circuit is powered by a phase locked loop voltage; and, said disturbance signal is fluctuation in said phase locked loop voltage.

13. The system of claim 12 wherein:

said disturbance signal is generated by coupling said phase locked loop voltage to ground through a first switch.

14. The system of claim 13 wherein said first switch controls the frequency of said disturbance signal.

15. The system of claim 12 wherein:

said disturbance signal is further generated by coupling said phase locked loop voltage to ground through a second switch.

16. The system of claim 15 wherein said second switch controls the magnitude of said disturbance signal.

* * * * *